US007341969B2

(12) United States Patent
Natsuhara et al.

(10) Patent No.: US 7,341,969 B2
(45) Date of Patent: Mar. 11, 2008

(54) ALUMINUM NITRIDE SINTERED BODY

(75) Inventors: Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 119 days.

(21) Appl. No.: 11/234,765

(22) Filed: Sep. 23, 2005

(65) Prior Publication Data

US 2006/0116272 A1 Jun. 1, 2006

(30) Foreign Application Priority Data

Oct. 20, 2004 (JP) ............................ 2004-304980

(51) Int. Cl.
*C04B 35/581* (2006.01)
*H05B 3/36* (2006.01)

(52) U.S. Cl. ...................................... 501/98.4; 219/553

(58) Field of Classification Search ............... 501/98.4, 501/98.5, 98.6; 219/553
See application file for complete search history.

(56) References Cited

U.S. PATENT DOCUMENTS 5,998,320 A * 12/1999 Yamada et al. ............ 501/98.4
6,486,085 B1 * 11/2002 Katsuda et al. ............ 501/98.4
6,800,576 B2 * 10/2004 Katsuda et al. ............ 501/98.4
7,081,425 B2 * 7/2006 Kanechika et al. ........ 501/98.4

FOREIGN PATENT DOCUMENTS

JP 2-26871 * 1/1990
JP 11-074064 A 3/1999
JP 2003292377 * 10/2003
JP 2005119953 * 5/2005

OTHER PUBLICATIONS

Patent Abstracts of Japan for JP11-074064 published Mar. 16, 1999.

* cited by examiner

*Primary Examiner*—Karl E Group
(74) *Attorney, Agent, or Firm*—Darby & Darby P.C.

(57) ABSTRACT

The object of the present invention is to provide a susceptor with superior thermal uniformity by minimizing pores in an aluminum nitride sintered body.

In an aluminum nitride sintered body according to the present invention, the tin content and sulfur content are controlled so that they are no more than a fixed amount. More specifically, in an aluminum nitride sintered body having as its main component aluminum nitride, the tin content in the aluminum nitride sintered body is no more than 50 ppm and the sulfur content is no more than 100 ppm. It would be preferable for a resistance heating body to be formed in the aluminum nitride sintered body and it would be preferable for the aluminum nitride sintered body to be used as a semiconductor heating unit.

6 Claims, No Drawings

ALUMINUM NITRIDE SINTERED BODY

BACKGROUND OF THE INVENTION

1. Field of the Invention

The present invention relates to an aluminum nitride sintered body substrate used in circuit substrates and semiconductor production device parts. More specifically, the present invention relates to an aluminum nitride sintered body suitable for use as a susceptor for heating semiconductor wafers and the like.

2. Description of the Background Art

Conventionally, aluminum nitride sintered bodies have been used for circuit substrates and the like because of their high thermal conductivity and their thermal expansion coefficient that is relatively close to that of silicon. Also, in recent years, the use of aluminum nitride has been proposed for probers for inspecting semiconductor wafers and heaters for heating semiconductor wafers to form conductor films, insulation films, and resist films on semiconductor wafers, for etching semiconductor wafers and the like. In these fields, the temperature distribution of the semiconductor wafer has a significant influence on the characteristics of the product. Since there is a need for a temperature distribution on the surface of the semiconductor wafer to be as uniform as possible, aluminum nitride, which has a relatively high thermal conductivity, is used.

For example, in Japanese Laid-Open Patent Publication No. Hei 11-74064, a metal paste, e.g., tungsten or molybdenum, is screen-printed on ceramic, e.g., aluminum nitride, to serve as a resistance heating body. This is then sintered, resulting in a wafer heating device in which a resistance heating body is embedded.

However, in this type of wafer heating device, the metal paste is applied to the ceramic using screen-printing, but the pattern can be smudged and pinholes can be formed during printing due to pores present on the ceramic surface. Also, when pores are present in the ceramic, transmission of heat generated by the resistance heating body is obstructed on the wafer mounting surface, thus reducing the uniformity of the temperature distribution of the wafer.

The object of the present invention is to overcome the problems described above and to provide a susceptor with superior thermal uniformity by minimizing pores in the aluminum nitride sintered body.

SUMMARY OF THE INVENTION

In the aluminum nitride sintered body of the present invention, the tin content and the sulfur content are controlled so that they are no more than fixed values. In an aluminum nitride sintered body having as its main component aluminum nitride, the tin content in the aluminum nitride sintered body is no more than 50 ppm and the sulfur content is no more than 100 ppm.

It would be preferable for a resistance heating body to be formed in the aluminum nitride sintered body, and it would be preferable for the aluminum nitride sintered body to be used as a semiconductor heating unit.

According to the present invention, by controlling the tin and sulfur content in an aluminum nitride sintered body to be no more than predetermined amounts, pores in the aluminum nitride sintered body can be minimized. A ceramic heater in which a resistance heating body is formed in an aluminum nitride sintered body with few pores provides superior thermal uniformity. Also, an aluminum nitride sintered body with a small number of pores provides superior corrosion resistance. By using this type of aluminum nitride sintered body as a semiconductor heating unit in a semiconductor fabrication device, a high degree of thermal uniformity and reliability is provided, and long-term usage is possible without a drop in performance.

DETAILED DESCRIPTION OF THE INVENTION

Generally, in aluminum nitride (AlN) sintered bodies, pores are present to some degree inside and on the surface. These pores can, for example, lead to smudging of the circuit pattern and pinholes when a resistance heating body circuit is applied by screen printing onto the aluminum nitride sintered body. Also, even smudging and pinhole formation does not take place during printing, pores present on the surface can burst due to thermal expansion during the sintering of the printed resistance heating body, thus leading to breaks in the circuit. Also, even if a resistance heating body circuit is formed on a shaped body such as an aluminum nitride green sheet, and this is sintered, pores will be present inside the aluminum nitride sintered body and at the boundary surfaces with the resistance heating body. Also, when a coil, e.g., a molybdenum coil, is embedded in aluminum nitride powder and sintered to form a resistance heating body circuit, pores will exist in the aluminum nitride sintered body and the boundary surfaces with the coil.

Ceramic sintered bodies are often used in susceptors (wafer support bodies) used in semiconductor fabrication devices and inspection devices, and aluminum nitride sintered bodies formed with resistance heating bodies as described above are often used. In semiconductor fabrication devices and inspection devices, a wafer is heated and various operations and inspections are performed, and it is very important to provide a uniform temperature distribution since the temperature distribution on the wafer affects wafer characteristics and yield.

As a result, in order to achieve thermal uniformity to at least a fixed degree, the resistance heating body circuit pattern described above is designed carefully using simulations and the like, and a high degree of control is applied to the thickness and alignment of the resistance heating body circuit in the application of screen printing and the like and the embedding of the metal coil and the like. However, when pores are formed as described above, the pattern width and film thickness of the resistance heating body circuit can vary locally when screen-printing or the like is performed, resulting in local variations in the resistance of resistance heating body circuit, which leads to the heat generation varying from the design value. When the generated heat varies from the design value, the temperature distribution on the wafer mounting surface of the susceptor is less uniform. Also, when a coil is used, pores present at the boundary surfaces with the coil obstruct heat transmission, resulting in non-uniform temperature distribution on the wafer mounting surface.

In either case, the pores in the sintered body obstruct the transmission of heat from the heat-generating body to the wafer mounting surface, leading to non-uniform temperature distribution on the wafer mounting surface. For example, when pores are present on the wafer mounting surface, heat transmission to the area immediately above the pore will be obstructed when the wafer is mounted directly on the wafer mounting surface or is mounted at a distance of approximately 0.2 mm or less away from the wafer mounting surface, thus tending to reduce the temperature immediately above the pore.

Also, if pores are formed on the surface of a susceptor in which a resistance heating body is not formed, the use of a corrosive gas can corrode the pore region, tending to lead to the formation of loose particles.

Based on a detailed analysis of the pores formed in aluminum nitride sintered bodies, the present inventors determined that tin and sulfur are present in small quantities in the pores. The tin and sulfur content and its relation to the number of pores in the sintered body was studied, and it was found that the number of pores in the aluminum nitride sintered body can be reduced to a level that is essentially negligible if the tin content is no more than 50 ppm and the sulfur content is no more than 100 ppm.

While some degree of advantage can be obtained by reducing either the tin content or the sulfur content, an aluminum nitride sintered body with superior thermal uniformity can be obtained by reducing the content of both. Completely eliminating tin and sulfur from the aluminum nitride sintered body is difficult, but raw materials with low tin and sulfur content can be used as the powder to form aluminum nitride, the sintering aid, and the like in order to obtain tin and sulfur contents that are within the range described above. Even if the tin and sulfur content in the raw powder exceeds 50 ppm or 100 ppm respectively, they are volatilized during sintering, so that the contents in the sintered body will be no more than 50 ppm and 100 ppm respectively.

The mechanism by which the tin and sulfur content relates to the presence of pores in aluminum nitride sintered bodies is not clear, but the present inventors surmise that it may be as follows. Trace amounts of tin and sulfur compounds present in the raw aluminum nitride powder or that are mixed in during processing form vapor, e.g., SnS, $SnS_2$ vapor, during the production process of the aluminum nitride sintered body with pores being formed by volume expansion of vapor. Also, when the surface of the aluminum nitride sintered body is abraded and the resistance heating body circuit is formed on this abraded surface, the presence of tin and sulfur at the openings of the pores results in a situation where, when the metal paste used to form the resistance heating body is applied and baked, the metal reacts with the tin and the sulfur, especially when the metal is tungsten or molybdenum, leading to partial discoloration or the like of the resistance heating body circuit.

For the raw AlN powder, one with a specific surface of 2.0-5.0 $m^2/g$ would be preferable. If the specific surface is less than 2.0 $m^2/g$, the quality of sintering of the aluminum nitride is reduced. Also, if the value exceeds 5.0 $m^2/g$, agglomeration of the powder is especially prominent, making it difficult to handle. Furthermore, it would be preferable for the oxygen content contained in the raw powder to be no more than 2 percent by weight. If the oxygen content exceeds 2 percent by weight, the thermal conductivity of the sintered body is reduced. Also, it would be preferable for non-aluminum metal impurities content contained in the raw powder to be no more than 2000 ppm. If the metal impurities content exceeds this range, the thermal conductivity of the sintered body is reduced. In particular, it would be preferable for the content to be at least 500 ppm since group IV elements such as Si and ferrous elements such as Fe, act to reduce thermal conductivity of the sintered body.

AlN is a material that is difficult to sinter, so it would be preferable to add a sintering aid to the raw AlN powder. It would be preferable for the sintering aid to be a rare-earth element compound. Rare-earth element compounds react during sintering to aluminum oxides and aluminum oxynitrides present on the surfaces of the aluminum nitride powder thus promoting the densification of the aluminum nitride and acting to remove oxygen, which is a factor in reduced thermal conductivity of the aluminum nitride sintered body. As a result, the thermal conductivity of the aluminum nitride sintered body can be improved.

It would be preferable for the rare-earth element compound to be a yttrium compound, which is especially effective in removing oxygen. It would be preferable for the amount added to be 0.01-5 percent by weight. If the amount is less than 0.01 percent by weight, obtaining a densified sintered body is difficult and the thermal conductivity of the sintered body is reduced. Also, if the amount exceeds 5 percent by weight, the sintering aid will be present at the grain boundaries of the aluminum nitride sintered body, which, when a corrosive atmosphere is used, can lead to etching of the sintering aid at the grain boundaries, loose particles and grains of the sintering aid present at the grain boundaries. Furthermore, it would be preferable for the amount of sintering aid to be added to be no more than 1 percent by weight. If the amount is no more than 1 percent by weight, the sintering aid will not be present even at the triple point of the grain boundary, thus improving corrosion resistance.

Also, it would be possible to use for the rare-earth element compound, oxides, nitrides, fluorides, stearate compounds, and the like. Of these, oxides are preferable because they are inexpensive and easy to obtain. Also, stearate compounds have a high affinity with organic solvents, so that when the raw aluminum nitride powder and a sintering aid are mixed with an organic solvent, superior mixing properties will be obtained.

Next, a predetermined amount of solvent, binder, as well as deflocculant and dispersant when needed are mixed into the raw aluminum nitride powder and the sintering aid. The mixing can be performed using a ball mill, ultrasound, or the like. As a result of this mixing, a raw slurry is obtained.

An aluminum nitride sintered body is obtained by shaping and sintering the slurry. This can be achieved using the co-firing method or the post-metallizing method.

First, the post-metallizing method will be described. A spray drier or the like is used to form granules from the slurry. The granules are inserted into a predetermined die, and press forming is performed. It would be preferable for the press pressure to be at least 9.8 MPa. With a pressure of less than 9.8 MPa, it is often not possible to obtain adequate strength of the shaped body so that breakage tends to occur during handling.

The density of the shaped body varies according to the binder content and the amount of sintering aid added, but it would be preferable for the density to be at least 1.5 $g/cm^3$. If the density if less than 1.5 $g/cm^3$, the distance between raw powder particles becomes relatively large, making sintering difficult. Also, it would be preferable for the density of the sintered body to be no more than 2.5 $g/cm^3$. If the density exceeds 2.5 $g/cm^3$, it becomes difficult to adequately remove the binder in the shaped body in the following degreasing operation. This makes it difficult to obtain a densified sintered body as described above.

Next, the shaped body is heated in a non-oxidizing atmosphere, and degreasing is performed. If degreasing is performed in an oxidizing atmosphere such as in the open atmosphere, the surfaces of the AlN powder tends to oxidize, reducing thermal conductivity of the sintered body. It would be preferable for the non-oxidizing atmosphere gas to be nitrogen or argon. It would be preferable for the heating temperature of the degreasing operation to be at least 500 deg C. and no more than 1000 deg C. At a temperature of less than 500 deg C., the binder cannot be adequately removed, so that excessive carbon remains in the layered body after degreasing, obstructing the sintering performed in the subsequent sintering operation. Also, at a temperature that exceeds 1000 deg C., the amount of residual carbon becomes too low, reducing the ability to remove oxygen in the oxide film present on the AlN powdered surfaces, thus reducing the thermal conductivity of the sintered body.

Also, it would be preferable for the amount of residual carbon in the shaped body after degreasing to be no more than 1.0 percent by weight. If more than 1.0 percent by weight of carbon remains, sintering is obstructed and a densified sintered body cannot be obtained.

Next, sintering is performed. Sintering is performed in a non-oxidizing atmosphere such as nitrogen or argon at a temperature of 1700-2000 deg C. For this operation, it would be preferable for the moisture content in the atmosphere gas, e.g., nitrogen, to be no more than −30 deg C. at dew point. If there is higher water content, the AlN reacts with the moisture in the atmosphere gas during sintering, forming an oxynitride compound, which can lead to a reduction in thermal conductivity. Also, it would be preferable for the amount of oxygen in the atmosphere gas to be no more than 0.001 percent by volume. If the oxygen content is high, the AlN surface oxidizes, which can lead to reduced thermal conductivity.

Furthermore, it would be preferable to use a boron nitride (BN) shaped body as a tool during sintering. This BN shaped body has adequate heat resistance against the sintering temperature and is formed with a solid lubricant on its surface. Since this allows reduction of the friction between the layered body and the tool when the layered body is compressed, a sintered body with minimal distortion can be obtained.

The obtained sintered body is processed as necessary. If a conductive paste is to be screen-printed in the next operation, it would be preferable for the surface roughness of the sintered body to have an Ra of no more than 5 microns. If Ra exceeds 5 microns, when the circuit is formed by screen-printing, defects such as pattern smudging and pinholes tend to take place. It would be more preferable for the surface roughness to have an Ra of no more than 1 micron.

When abrading to achieve the above surface roughness, abrading should be performed on both surfaces not only when both surfaces of the sintered body are to be screen-printed, but also when printing is to be performed only on one surface. If abrading is performed only the surface to be screen-printed, the sintered body will be supported during screen printing on the surface that was not abraded. Since projections and contaminants can be present on the surface that was not abraded, the securing of the sintered body can be unstable, which can lead to problems in properly rendering the circuit pattern with screen printing.

Also, it would be preferable for the parallelism of both processed surfaces to be no more than 0.5 mm. If the parallelism exceeds 0.5 mm, there may be inconsistencies in the thickness of the conductive paste when screen-printing. It would be more preferable for the parallelism to be no more than 0.1 mm. Furthermore, it would be preferable for the flatness of the surface to be screen-printed to be no more than 0.5 mm. If the flatness exceeds 0.5 mm, the thickness of the conductive paste can have significant variations. It would be especially preferable for the flatness to be no more than 0.1 mm.

The conductive paste is applied by screen-printing to the abraded sintered body to form an electrical circuit. The conductive paste can be obtained by mixing a metal powder, a solvent, a binder, and an oxide powder as needed. In order to match thermal expansion coefficients with the ceramic, it would be preferable for the metal powder to be tungsten or molybdenum or tantalum.

Also, to improve adhesion strength with AlN, it would also be possible to add oxide powder. It would be preferable for the oxide powder to be an oxide of a group II-A element or a group III-A element, $Al_2O_3$, $SiO_2$, or the like. In particular, it would be preferable to use yttrium oxide due to its extremely good wettability with regard to AlN. It would be preferable for the amount of oxide added to be 0.1-30 percent by weight. If the amount is less than 0.1 percent by weight, the adhesion strength between AlN and the metal layer, i.e., the formed electrical circuit, is reduced. Also, if the amount exceeds 30 percent by weight, the electrical resistance of the metal layer, i.e., the electrical circuit, increases.

It would be preferable for the thickness of the conductive paste to be at least 5 microns and no more than 100 microns after drying. If the thickness is less than 5 microns, the electrical resistance becomes too high and the adhesion strength drops. Also, if the thickness exceeds 100 microns, the adhesion strength decreases.

Also, if the formed circuit pattern is a heater circuit (heat-generating body circuit), it would be preferable for the pattern pitch to be no more than 0.1 mm. If the pitch is less than 0.1 mm, current leakage can take place depending on the temperature and the applied voltage when current flows through the heat-generating body, leading to a short circuit. In particular, it would be preferable when temperatures of at least 500 deg C. are to be used, for the pattern pitch to be at least 1 mm, and it would be even more preferable for the pitch to be at least 3 mm.

Next, after degreasing the conductive paste, sintering is performed. The degreasing is performed in a non-oxidizing atmosphere such as nitrogen or argon. It would be preferable for the degreasing temperature to be at least 500 deg C. At a temperature of less than 500 deg C., the removal of the binder in the conductive paste is inadequate, resulting in residual carbon in the metal layer. This leads to metal carbide being formed during sintering, which leads to increased electrical resistance in the metal layer.

It would be preferable for the firing to be performed in a non-oxidizing atmosphere such as nitrogen or argon at a temperature of at least 1500 deg C. At a temperature of less than 1500 deg C., the progression of particle growth of the metal powder in the conductive paste is retarded, resulting in an excessively high electrical resistance for the metal layer after firing. Also, it would be preferable for the firing temperature to not exceed the sintering temperature of the ceramic. If the conductive paste is fired at a temperature that exceeds the sintering temperature of the ceramic, the sintering aid contained in the ceramic begins to volatilize, and particle growth of the metal powder in the conductive paste is accelerated, reducing adhesion strength between the ceramic and the metal layer.

Next, an insulation coat can be formed on the metal layer in order to keep the formed metal layer insulated. There are no special restrictions on the material used for the insulation coat as long as its reactivity with the electrical circuit is low and the thermal expansion coefficient difference with AlN is no more than $5.0\times10^{6}$/K. For example, crystallized glass, AlN, or the like can be used. These examples can, for example, be formed into a paste that is screen-printed at a predetermined thickness, and sintered at a predetermined temperature after degreasing if necessary.

It would be preferable for the amount of sintering aid to be added to be at least 0.01 percent by weight. If the amount is less than 0.01 percent by weight, the insulation coat does not densify, making it difficult to keep the metal layer insulated. Also, it would be preferable for the sintering aid to not exceed 20 percent by weight. If the amount exceeds 20 percent by weight, the excess sintering aid can permeate into the metal layer, and change the electrical resistance of the metal layer. There are no particular restrictions on the thickness of application, but it would be preferable for the thickness to be at least 5 microns. If the thickness is less than 5 microns, keeping the metal layer insulated becomes difficult.

It would be possible to use silver or a mixture or alloy of palladium, platinum, or the like for the conductive paste. By adding palladium or platinum based on the silver content, the volume resistivity of the conductor is increased so that the amount added can be adjusted according to the circuit pattern. Also, these additives serve to prevent migration between circuit patterns, so that it would be preferable for at least 0.1 part by weight to be added per 100 parts by weight of silver.

In order to maintain adhesiveness with AlN, it would be preferable to add a metal oxide to these metal powders. For example, aluminum oxide, silicon oxide, copper oxide, boron oxide, zinc oxide, lead oxide, rare-earth oxides, transition metal oxides, alkaline-earth metal oxides, and the like can be added. It would be preferable for the amount added to be at least 0.1 percent by weight and no more than 50 percent by weight. If the content is less than this range, it would not be preferable because of a reduction in adhesiveness with aluminum nitride. If the content is greater than this range, it would not be preferable because there would be obstruction of sintering of the metal components such as silver.

These metal powders and inorganic powders are mixed, and an organic solvent and a binder is added, the paste is formed, and the circuit can be formed using screen-printing as described above. In this case, the formed circuit pattern is sintered in an inert gas such as nitrogen or in the open atmosphere at a temperature in the range of 700 deg C. to 1000 deg C.

In order to maintain insulation between circuits, a crystallized glass, glazed glass, organic resin, or the like can be applied and sintered or cured in order to form an insulation layer. Types of glass that can be used include borosilicate glass, lead oxide, zinc oxide, aluminum oxide, silicon oxide, or the like. An inorganic solvents and binder are added to these powders, a paste is formed, and the paste is applied using screen-printing. There is no special restriction on the thickness of application, but it would be preferable for the thickness to be at least 5 microns. With a thickness of less than 5 microns, maintaining insulative properties becomes difficult. Also, it would be preferable for the sintering temperature to be a temperature lower than the temperature used to form the circuit. If sintering is performed at a temperature higher than that used to sinter the circuit, the resistance of the circuit pattern changes greatly.

Next, it would also be possible when necessary to layer ceramic substrates. The layering should be performed using a bonding agent. For the bonding agent, a group II-A element compound or a group III-A element compound and a binder and solvent is added to aluminum oxide powder or aluminum nitride powder, and the a paste is formed which is then applied using screen-printing or the like to the bonding surface. There are no special restrictions on the thickness of the application of the bonding agent, but it would be preferable for the thickness to be at least 5 microns. With a thickness of 5 microns, bonding defects such as pinholes and uneven bonding can take place in the bonding layer.

The ceramic substrate on which the bonding layer is applied is degreased in a non-oxidizing atmosphere in a temperature of at least 500 deg C. Then, the ceramic substrates to be layered are stacked, a predetermined load is applied, heating is performed in a non-oxidizing atmosphere, and the ceramic substrates are bonded to each other. It would be preferable for the load to be at least 5 KPa. With a load of less than 5 KPa, adequate bonding strength cannot be obtained, or the bonding defects described above can take place.

There are no special restrictions on the heating temperature for bonding as long as the temperature is adequate for adhesion of the ceramic substrates to each other by way of the bonding layers. However, it would be preferable for the temperature to be at least 1500 deg C. If the temperature is less than 1500 deg C., it is difficult to obtain an adequate bonding strength, and bonding defects tend to take place. For the non-oxidizing atmosphere used in degreasing and bonding, it would be preferable to use nitrogen, argon, or the like.

A layered ceramic sintered body can be formed as described above to serve as a heater in a wafer support body. Instead of using a conductive paste, a molybdenum or tungsten mesh can be used for the electrical circuit, e.g., if the circuit is a heater circuit and a molybdenum wire (coil), electrostatic attraction electrode, or RF electrode or the like is used.

In this case, a molybdenum coil or mesh can be placed in the raw AlN powder and hot-pressing can be performed. The temperature and atmosphere for the hot-pressing operation can be the same as the sintering temperature and atmosphere used in sintering AlN as described above, but it would be preferable for the hot-pressing pressure to be at least 1.0 MPa. With a pressure of less than 1.0 MPa, gaps can form between the molybdenum coil or mesh and the AlN, obstructing the performance as a heater.

Next, the co-firing method will be described. The raw slurry described above is formed as a sheet using a doctor blade. There are no special restrictions regarding the shaping of the sheet, but it would be preferable for the thickness of the sheet to be no more than 3 mm after drying. If the sheet exceeds 3 mm, the drying shrinkage of the slurry increases, increasing the probability that fissures will form in the sheet.

A metal layer that will form an electrical circuit having a predetermined shape is formed on the sheet by applying conductive paste using screen printing or the like. The conductive paste can be the same as that described for the post-metallizing method. However, in the co-firing method, there is no problem in adding oxide powder to the conductive paste.

Next, the sheet on which the circuit is formed is layered with a sheet on which a circuit is not formed. The layering is done by setting each sheet at a predetermined position and stacking. A solvent can be applied between the sheets as needed. Heat is applied as needed, in the stacked state. If heat is to be applied, it would be preferable for the heating temperature to be no more than 150 deg C. If heating is performed at a temperature that exceeds this, the layered sheets will be significantly deformed. Then, pressure is applied to the layered sheets to integrate the stack. It would be preferable for the applied pressure to be in the range of 1-100 MPa. With a pressure of less than 1 MPa, the sheets will not be adequately integrated, which can lead to peeling at later stages. Also, if pressure exceeding 100 MPa is applied, the deformation of the sheets becomes excessive.

This layered body is degreased and sintered as in the post-metallizing method described above. The sintering temperature, the carbon content, and the like are the same as those for the post-metallizing method. When the conductive paste is to be printed on the sheet, it would be possible to easily produce electrical heaters having multiple electrical circuits by printing heater circuits, electrostatic attraction electrodes, and the like onto multiple sheets, and then layering these.

When an electrical circuit such as a heating circuit is formed on the outermost layer of the ceramic layered body, an insulation coat can be formed on the electrical circuit as in the post-metallizing method described above in order to protect the electrical circuit and to maintain insulative properties.

The obtained ceramic layered sintered body is processed as needed. In general, the precision needed for semiconductor fabrication devices is not provided in the sintered state. It would be preferable, e.g., for the mounting surface to have a flatness of no more than 0.5 mm, and it would be more preferable for the flatness to be no more than 0.1 mm. If the flatness exceeds 0.5 mm, gaps tend to form between the object being processed and the wafer support body. This prevents uniform transfer of the heat of the wafer support body to the object being processed, resulting in a tendency for temperature inconsistencies to form in the object being processed.

Also, it would be preferable for the surface roughness of the wafer support surface to have an Ra of no more than 5 microns. If the Ra exceeds 5 microns, friction between the wafer and the wafer support body can increase the number of loose grains of AlN. When this happens, the loose particles become grains and can negatively affect wafer processing, e.g., film formation and etching. Furthermore, it would be preferable for the surface roughness to have an Ra of no more than 1 micron.

The heater for a wafer support body can be made as described above. A support section is then attached to the heater. There are no special restrictions on the material used for the support section as long as it has a thermal expansion coefficient that does not significantly differ from the thermal expansion coefficient of the ceramic of the heater, but it would be preferable for the difference from the thermal expansion coefficient of the heater to be no more than $5\times10^{-6}$/K.

If the difference between the thermal expansion coefficients exceeds $5\times10^{-6}$/K, cracks and the like can form around a junction between the heater and the support section during attachment, and even if cracks do not form during attachment, heat cycles at the junction from repeated usage can lead to splits and cracks. If, for example, the heater is formed from AlN, AlN would be the most preferable material for the support section, but it would also be possible to use silicon nitride, silicon carbide, mullite, or the like.

The attachment is performed by way of a bonding layer. It would be preferable for the components of the bonding layer to be formed from AlN and $Al_2O_3$ and rare-earth oxides. These components have good wettability with ceramics such as AlN, which is used for the support section. Thus, a relatively high bonding strength is achieved, and a sealed bonding surface can be achieved relatively easily.

It would be preferable for the bonding surfaces of the support section and the heater to have flatnesses of no more than 0.5 mm. If the flatnesses exceed this, gaps tend to form at the bonding surface, making it difficult to obtain a bond with adequate sealing. A flatness of no more than 0.1 mm is more preferable. It would be even more preferable for the flatness of the bonding surface of the heater to be no more than 0.02 mm. Also, it would be preferable for the surface roughness of the bonding surfaces to have an Ra of no more than 5 microns. If the surface roughness exceeds this, gaps tend to form at the bonding surface. It would be more preferable for the surface roughness to be no more than 1 micron.

Next, an electrode is attached to the heater. Attachment can be performed using well-known methods. For example, spot facing can be performed from the surface opposite from the wafer support surface of the heater section to the electrical circuit. Metallizing can be performed on the electrical circuit or brazing metal can be used directly with no metallizing, and an electrode, e.g., molybdenum or tungsten electrode, can be connected. Then, plating is performed on the electrode as needed, improving oxidation resistance.

Finally, a ring-shaped groove is machined at the area of and outward from the junction between the heater and the support section. This completes the formation of a wafer support body for a semiconductor fabrication device. The ring-shaped groove can be formed on the shaped body before sintering, and can also be formed before bonding the support section.

Also, the wafer support body of the present invention can be installed in a semiconductor device for the processing of a semiconductor wafer. The wafer support body of the present invention provides a high degree of reliability at the junction between the heater and the support section, allowing semiconductor wafers to be processed in a stable manner over a long period of time.

FIRST WORKING EXAMPLE

Six types of raw aluminum nitride powder containing tin and sulfur were prepared. The aluminum nitride powders had average particle diameters of 0.6 microns and specific surfaces of 3.4 $m^2/g$. To these aluminum nitride (AlN) powders, 0.7 percent by weight of yttrium oxide was added, an acrylic binder and an organic solvent was added, and these were mixed with a ball mill for 24 hours to produce a slurry. Powder granules are formed by spray drying the slurry. The powder was press molded, degreased in a nitrogen atmosphere at 700 deg C., and sintered for 5 hours at 1850 deg C. in a nitrogen atmosphere, resulting in an AlN sintered body. Table 1 shows a chemical analysis of the tin (Sn) and sulfur (S) content in these AlN sintered bodies.

The obtained AlN sintered bodies were machined to a diameter of 330 mm and a thickness of 15 mm. Next, for the resistance heating-body, 1 percent by weight of $Y_2O_3$ was added to W powder having an average particle of 2.0 microns. A binder and a solvent was then added to form a W paste. A pot mill and a three-roll mill were used for mixing. This W paste was screen-printed to form a heater circuit patterns on the AlN sintered bodies.

The AlN sintered bodies with printed heater circuits were degreased at 800 deg C. in a nitrogen atmosphere, and the heater circuits were fired at 1830 deg C. in a nitrogen atmosphere. To protect these heater circuits, an organic solvent and binder were added to $ZnO—B_2O_3—SiO_2$ powder and a paste was formed. The paste was screen-printed at a thickness of 200 microns over the entire surface on which the heater circuit was formed. This was then degreased in the open atmosphere at 350 deg C., and fired at 700 deg C. in a nitrogen atmosphere to form a protective layer.

Next, the surfaces opposite from the surfaces on which the heater circuits were formed (the wafer support surfaces) were abraded and finished to a thickness of 14 mm and a flatness of 50 microns. Spot facing was performed from the surface opposite from the wafer support surface to the heater circuit and a section of the heater circuit was exposed. An Mo electrode was screwed to the exposed heater circuit section.

A temperature measurement wafer with 17 measurement points having a diameter of 300 mm was mounted on the wafer support surfaces of the wafer support body. Power was supplied to the heater circuits and heat was applied so that the temperature of the center of the heat measurement wafer reached 180 deg C. The difference between the maximum value and the minimum value of the 17 temperatures was recorded as the temperature distribution. Furthermore, after measurement, the wafer support body was broken and the cross-section surface was studied under an SEM to determine the maximum diameter of pores present inside and the number of pores. This was done by observing 20 random points at a magnification level of 100×. The results are shown in Table 1.

TABLE 1

| No. | Sn content in raw powder (ppm) | S content in raw powder (ppm) | Sn content in sintered body (ppm) | S content in sintered body (ppm) | Temperature distribution (deg C.) | Maximum pore diameter (microns) | Number of pores |
|---|---|---|---|---|---|---|---|
| 1 | 43 | 82 | 12 | 30 | 0.33 | 3 | 2 |
| 2 | 88 | 143 | 30 | 65 | 0.34 | 3 | 3 |
| 3 | 162 | 213 | 49 | 100 | 0.38 | 4 | 5 |
| 4 | 140 | 262 | 45 | 130 | 0.53 | 11 | 13 |
| 5 | 444 | 175 | 150 | 85 | 0.59 | 13 | 10 |
| 6 | 628 | 701 | 220 | 340 | 0.81 | 25 | 24 |

As Table 1 shows, if the tin content is no more than 50 ppm and the sulfur content is no more than 100 ppm in the aluminum nitride sintered bodies, the number of pores is low, the maximum pore diameter is small, and superior temperature distribution is provided.

SECOND WORKING EXAMPLE

Using the six types of raw aluminum nitride powder used in the first working example, a slurry was formed in the same manner as the first working example except that 1 percent by weight of yttrium oxide was added. This slurry was formed into sheets using the doctor blade method. Next, ethylene cellulose was added as a binder to W powder having an average particle diameter of 2.0 microns, an organic solvent was added, and the results were mulled to form W paste. This W paste was screen-printed on the AlN sheets to form heater circuit patterns. Layered bodies were formed by layering multiple sheets so that the thickness after sintering would be 15 mm. These layered bodies were degreased in a nitrogen atmosphere at 800 deg C. and then sintered for 10 hours at 1880 deg C. in a nitrogen atmosphere to form AlN sintered bodies. These were finished into wafer support bodies having wafer support surfaces with flatness 50 microns and thickness 14 mm as in the first working example, and evaluations were performed as in the first working example. The results are shown in Table 2.

TABLE 2

| No. | Sn content in raw powder (ppm) | S content in raw powder (ppm) | Sn content in sintered body (ppm) | S content in sintered body (ppm) | Temperature distribution (deg C.) | Maximum pore diameter (microns) | Number of pores |
|---|---|---|---|---|---|---|---|
| 7 | 43 | 82 | 9 | 24 | 0.33 | 3 | 2 |
| 8 | 88 | 143 | 26 | 58 | 0.35 | 4 | 3 |
| 9 | 162 | 213 | 47 | 83 | 0.39 | 4 | 6 |
| 10 | 140 | 262 | 41 | 113 | 0.53 | 16 | 13 |
| 11 | 444 | 175 | 126 | 82 | 0.59 | 14 | 12 |
| 12 | 628 | 701 | 185 | 295 | 0.81 | 29 | 19 |

As shown in Table 2, with the co-firing method also, if the tin content is no more than 50 ppm and the sulfur content is no more than 100 ppm, the number of pores is low, the maximum pore diameter is small, and superior temperature distribution is provided. Also, since the sintering temperature was higher relative to that of the first working example, the amounts of tin and sulfur elements were lower than those of the first working example.

THIRD WORKING EXAMPLE

Using the six types of raw aluminum nitride powder used in the first working example, a slurry were formed in the same manner as the first working example except that 3 percent by weight of yttrium oxide was added, resulting in granules. Next, the granules were pressed and grooves were formed on the shaped bodies. Mo coils with diameters of 4 mm were embedded in these grooves to form heater circuits. Then, the space above the grooves in which the Mo coils are embedded was filled with AlN granules, and press forming was performed so that the thickness after sintering would be 15 mm. The shaped body was sintered using the hot-press method for 5 hours under a load of 10 MPa in a nitrogen atmosphere at 1880 deg C., resulting in an AlN sintered body. As in the first working example, these were finished into wafer support bodies having wafer support surfaces having a flatness of 50 microns and 14 mm thickness and evaluations were performed as in the first working example. The results are shown in Table 3.

TABLE 3

| No. | Sn content in raw powder (ppm) | S content in raw powder (ppm) | Sn content in sintered body (ppm) | S content in sintered body (ppm) | Temperature distribution (deg C.) | Maximum pore diameter (microns) | Number of pores |
|---|---|---|---|---|---|---|---|
| 13 | 43 | 82 | 8 | 22 | 0.36 | 4 | 2 |
| 14 | 88 | 143 | 24 | 54 | 0.38 | 4 | 5 |
| 15 | 162 | 213 | 45 | 79 | 0.41 | 5 | 8 |
| 16 | 140 | 262 | 40 | 109 | 0.61 | 23 | 13 |
| 17 | 444 | 175 | 121 | 80 | 0.73 | 27 | 14 |
| 18 | 628 | 701 | 174 | 281 | 0.94 | 31 | 19 |

As shown in Table 3, when Mo coils are used as heat-generating bodies, if the tin content is no more than 50 ppm and the sulfur content is no more than 100 ppm, in this case also the number of pores is low, the maximum pore diameter is small, and superior temperature distribution is provided.

FOURTH WORKING EXAMPLE

Using the six types of raw aluminum nitride powder used in the first working example, a slurry was formed as in the first working example except that 1.5 percent by weight of yttrium oxide was added, resulting in granules. Next, the granules were pressed and degreased at 800 deg C. in a nitrogen atmosphere, and then sintered for 7 hours at 1840 deg C. in a nitrogen atmosphere to form an AlN sintered body. These AlN sintered bodies were cut into 10 mm cubes and the 10 mm×10 mm surfaces were mirror-finished using diamond abrasive. The surface roughness (Ra) was then measured.

Then, a 100-hour corrosion test was performed at 500 deg C. in a $CF_4$ atmosphere on the AlN sintered bodies. After the corrosion test, the surface roughness was measured again. For the surface roughness, 10 points were measured and the average value was calculated. The results are shown in Table 4.

TABLE 4

| No. | Sn content in raw powder (ppm) | S content in raw powder (ppm) | Sn content in sintered body (ppm) | S content in sintered body (ppm) | Ra before corrosion test (microns) | Ra after corrosion test (microns) |
|---|---|---|---|---|---|---|
| 19 | 43 | 82 | 11 | 29 | 0.10 | 0.23 |
| 20 | 88 | 143 | 31 | 64 | 0.10 | 0.26 |
| 21 | 162 | 213 | 50 | 97 | 0.10 | 0.38 |
| 22 | 140 | 262 | 44 | 132 | 0.10 | 0.54 |
| 23 | 444 | 175 | 153 | 82 | 0.10 | 0.63 |
| 24 | 628 | 701 | 221 | 351 | 0.10 | 1.01 |

As shown in Table 4, superior corrosion resistance can be provided if the tin content is no more than 50 ppm and the sulfur content is no more than 100 ppm.

According to the present invention, by keeping the tin and sulfur content in an aluminum nitride sintered body to predetermined amounts or less, pores in the aluminum nitride sintered body can be minimized. In a ceramic heater formed by a resistance heating body in an aluminum nitride sintered body with few pores, superior thermal uniformity can be provided. Also, aluminum nitride sintered bodies with few pores provide superior corrosion resistance. When this type of aluminum nitride sintered body is used in a semiconductor heating unit in a semiconductor fabrication device, a high degree of thermal uniformity and reliability is provided and performance does not decrease over a long period of time.

What is claimed is:

1. An aluminum nitride sintered body having as its main component aluminum nitride, wherein tin content in said aluminum nitride sintered body is held to between 8 ppm and 50 ppm, and sulfur content is held between 22 ppm and 100 ppm.

2. An aluminum nitride sintered body according to claim 1, wherein a maximum diameter of pores present in a surface of the aluminum nitride sintered body is held to between 3 μm and 5 μm.

3. An aluminum nitride sintered body according to claim 1, wherein:

the aluminum nitride body has a surface finished to an initial average surface roughness of 0.10 μm, and after being exposed to a $CF_4$ atmosphere at 500° C. for 100 hours, the average roughness of the surface has increased to no more than 0.38 μm.

4. An aluminum nitride sintered body according to claim 1, wherein a resistance heating body is formed in said aluminum nitride sintered body.

5. An aluminum nitride sintered body according to claim 1, wherein said aluminum nitride sintered body is used as a semiconductor heating unit.

6. An aluminum nitride sintered body according to claim 4, wherein said aluminum nitride sintered body is used as a semiconductor heating unit.

* * * * *